United States Patent
Trimberger (10) Patent No.: US 6,687,884 B1
(45) Date of Patent: Feb. 3, 2004

(54) TESTING FOR SHORTS BETWEEN INTERCONNECT LINES IN A PARTIALLY DEFECTIVE PROGRAMMABLE LOGIC DEVICE

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 69 days.

(21) Appl. No.: 10/147,732

(22) Filed: May 16, 2002

(51) Int. Cl.[7] .................. G06R 17/50; G01R 31/28
(52) U.S. Cl. ........................... 716/4; 714/725
(58) Field of Search .................. 716/4, 5, 6, 16, 716/17; 714/724, 725

(56) References Cited

U.S. PATENT DOCUMENTS

| | | |
|---|---|---|
| 4,695,740 A | 9/1987 | Carter |
| 4,713,557 A | 12/1987 | Carter |
| 4,835,418 A | 5/1989 | Hsieh |
| 5,031,180 A | 7/1991 | McIver et al. |
| RE34,363 E | 8/1993 | Freeman |
| 5,278,841 A * | 1/1994 | Myers ............ 714/717 |
| 5,517,135 A | 5/1996 | Young |
| 5,925,920 A | 7/1999 | MacArthur et al. |
| 6,104,211 A | 8/2000 | Alfke |
| 6,526,559 B2 | 2/2003 | Schiefele et al. |
| 6,594,610 B1 * | 7/2003 | Toutounchi et al. ........ 702/117 |

* cited by examiner

*Primary Examiner*—Leigh M. Garbowski
(74) *Attorney, Agent, or Firm*—Lois D. Cartier (57) ABSTRACT

Methods of detecting shorts affecting nets of a specified design in a partially defective PLD. The nets participating in the design are identified, along with the interconnect lines used to implement each net. The nets are then divided into two or more groups, where no two nets in a single group can be shorted together by the inadvertent enablement of a single programmable interconnect point between two interconnect lines. The groups are then tested for inadvertent shorts. According to a first aspect of the invention, each group is tested sequentially against all interconnect lines not in the group, or against all nets in other groups. According to another aspect, the groups are tested simultaneously by applying a different stimulus pattern to each group. By comparing a detected value pattern to the stimulus patterns applied to other groups, it can be determined which two groups are participating in the short.

22 Claims, 5 Drawing Sheets

TESTING FOR SHORTS BETWEEN INTERCONNECT LINES IN A PARTIALLY DEFECTIVE PROGRAMMABLE LOGIC DEVICE

FIELD OF THE INVENTION

The invention relates to programmable logic devices (PLDs). More particularly, the invention relates to methods of testing for shorts between interconnect lines in a partially defective PLD that will prevent the PLD from being used with a specified design.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAM, and so forth).

The various logic blocks are interconnected by a programmable interconnect structure that includes a large number of programmable interconnect lines (e.g., metal wires). The interconnect lines and logic blocks are interconnected using programmable interconnect points (PIPs). A PIP can be, for example, a CMOS passgate. When the passgate is turned on (i.e., the PIP is enabled), the two interconnect lines on either side of the passgate are electrically connected. When the passgate is turned off (i.e., the PIP is disabled), the two interconnect lines are isolated from each other. Thus, by controlling the values on the gate terminals of the PIPs, circuit connections can be easily made and altered.

PIPs can be implemented in many different ways. For example, a buffered PIP can be implemented as a tristate buffer. When the tristate signal is low, the buffer output is not driven, and the two interconnect lines on either side of the buffer are isolated from each other. When the tristate signal is high, one of the interconnect lines drives the other interconnect line in a unidirectional connection.

Various exemplary types of PIPs are described by Freeman in U.S. Pat. No. Re. 34,363, by Carter in U.S. Pat. Nos. 4,695,740 and 4,713,557, by Hsieh in U.S. Pat. No. 4,835,418, and by Young in U.S. Pat. No. 5,517,135, all of which are hereby incorporated by reference. Some PIPs are unidirectional and some are bidirectional. Some are buffered and some are not buffered. However, the various types of PIPs typically have this in common, that they are controlled by a single data value stored in a memory cell called a configuration memory cell.

The logic blocks and PIPs in a PLD are typically programmed (configured) by loading data from a configuration data file into thousands of configuration memory cells that define how the logic blocks and interconnect lines are configured and interconnected. In Field Programmable Gate Arrays (FPGAs), for example, each configuration memory cell is implemented as a static RAM cell.

Each PLD typically contains many thousands of configuration memory cells. A fabrication defect in any one of these memory cells makes the PLD defective for most purposes, as by the very nature of an PLD a user design can be implemented using any of the programmable resources in the device. Hence, for example, an FPGA manufacturer typically tests the functionality of each logic block and each PIP in every FPGA prior to selling the FPGA to a customer.

One type of defect that can occur is a defect in a PIP or in the memory cell controlling the PIP, such that the PIP is always enabled. In this situation, the two nets on either side of the PIP are shorted together. A PLD having this type of defect is partially defective and cannot be sold as a fully functional device.

However, if a single, specified design (i.e., a given configuration data file) will be implemented in a PLD, it is not necessary for each and every PIP in the PLD to be fully functional. It is only necessary for each PIP that affects that particular design to be functional. Any PIP actually used in routing the design must either function properly, or the defect must be such that the PIP is permanently turned on. In addition, any PIP that, if defective, will undesirably short a net in the design to some other net in the design must either function properly, or the defect must be such that the PIP is permanently turned off.

These requirements can best be understood by reviewing an example that is now explained in connection with FIG. 1.

Figure 1:
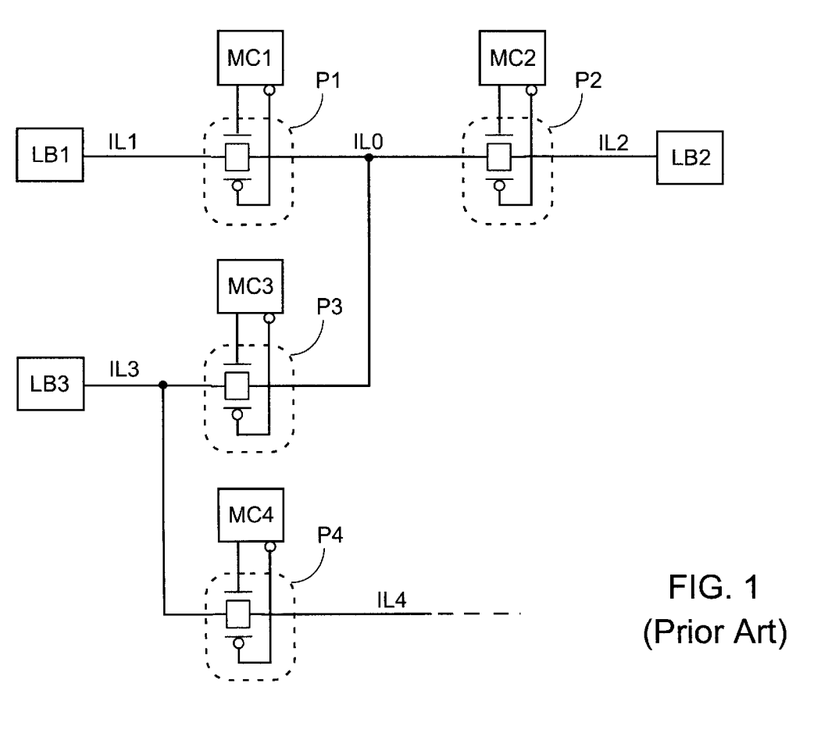
FIG. 1 shows an exemplary structure in a programmable logic device (PLD).

FIG. 1 shows a portion of a PLD that includes three logic blocks LB1–LB3, five interconnect lines IL0–IL4, and four PIPS P1–P4. Interconnect lines IL1–IL3 are coupled to logic blocks LB1–LB3, respectively. Interconnect lines IL1–IL3 can each be programmably coupled to interconnect line IL0 through PIPs P1–P3, respectively. Interconnect line IL4 can be programmably coupled to interconnect line IL3 through PIP P4.

PIPS P1–P4 are respectively controlled by four memory cells MC1–MC4. When the value stored in one of the memory cells is high, the passgate in the associated PIP is enabled. When the value stored in one of the memory cells is low, the interconnect lines on either side of the associated PIP are not connected together. They can be left unconnected or wired as parts of two separate circuits.

As an example, consider the case where memory cells MC1, MC2, and MC4 each store a high value and memory cell MC3 stores a low value. As specified by the configuration data file, PIPs P1 and P2 should be enabled, connecting together interconnect lines IL1, IL0, and IL2 to form a first net. PIP P4 should also be enabled, connecting together interconnect lines IL3 and IL4 to form a second net. PIP P3 should be disabled, isolating the first and second nets from each other.

Suppose that memory cell MC1 is defective, and the value stored in memory cell MC1 is permanently set to a high value. Because PIP P1 should be enabled for this design, there is no effect on the specified design. Therefore, this defect does not prevent this PLD from being used to implement the specified design. The effect is the same if there is some defect in the PIP itself that renders the PIP permanently enabled (i.e., turned on whenever the device is configured and/or power is supplied to the PLD).

However, suppose that memory cell MC1 or PIP P1 is defective such that PIP P1 is permanently disabled (i.e., turned off whenever the device is configured and/or power is supplied to the PLD). The first net is incomplete, so the specified design does not work in this partially defective PLD.

Now suppose that memory cell MC3 or PIP P3 is defective such that PIP P3 is permanently disabled. Because PIP P3 should be disabled for this design, there is no effect on the specified design. Therefore, this defect does not prevent this PLD from being used to implement the specified design.

However, suppose that memory cell MC3 or PIP P3 is defective such that PIP P1 is permanently enabled. The first and second nets are shorted together. The specified design does not work in this partially defective PLD.

PLDS are growing larger every year, and the larger an integrated circuit device, the more likely it is that the device will contain fabrication defects. Thus, larger PLDs are more expensive than smaller ones, not just because more silicon area is needed, but also because the likelihood of fabrication defects is higher. Thus, discarding all defective PLDs is an expensive alternative, and growing more expensive with time. However, the above examples clearly demonstrate that some partially defective PLDs can still be used in limited circumstances. A given partially defective PLD can be used with some specified designs, and not with other specified designs. Therefore, it is highly desirable to provide methods that contribute to the use of partially defective PLDs.

Clearly, if a partially defective PLD is to be used with a specified design, the PLD must be tested to see if the design will function properly in that device. One method of testing a design is simply to download the configuration data file for the design into the partially defective PLD and then operate the resulting circuit to see if it works. However, it can be a very lengthy process to test every conceivable combination of data values and data sequences that can occur in a complicated design. Therefore, it is generally preferred to perform a test of each PLD resource used in the specified design, and verify that the resource is operating correctly. If each PLD resource affecting the design functions properly and the customer has generated and tested the design correctly, it can be assumed that the PLD can be used for that design.

One test that is typically performed to determine the suitability of a PLD for a specified design is a "short test" (i.e., a test for inadvertent couplings between two nodes). In this test, all nets that are used in the design are driven to a known value. At the same time, all routing resources not used in the design are driven to the opposite value. Logic blocks driven by the nets are configured to check for the expected value on each net.

For example, all nets used in the design can be driven high by configuring the logic block driving each net to provide a high value, while all unused PLD routing resources are tied to ground. Additionally or alternatively, all nets used in the design can be driven low by configuring the logic block driving each net to provide a low value, while all unused PLD routing resources are tied to power high.

The value on each net, or the result of a logical function performed on one or more of the nets, is typically provided to the tester via an output terminal of the PLD. For example, the value or result can be read back from the PLD using well-known PLD data readback or JTAG techniques. The logic value is then compared with the expected value. If the observed value does not match the expected value, one or more nets are shorted to unused interconnect resources. The tested PLD cannot be used for the specified design.

These known short tests can detect a defectively enabled PIP between a net used in the specified design and an unused interconnect resource. However, shorting together two nets that are both tied to the same value does not give an anomalous result. Hence, the known test methods do not detect a defectively enabled PIP between two different nets when both nets are used in the specified design.

Therefore, it is desirable to provide methods of detecting shorts between two nets of a specified design in a partially defective PLD.

SUMMARY OF THE INVENTION

The invention provides methods of detecting shorts affecting nets of a specified design in a partially defective programmable logic device (PLD).

According to the methods of the invention, the nets participating in the specified design are identified, and the interconnect lines used to implement each net are identified. The nets are then divided into two or more groups, where no two nets in a single group can be shorted together by the inadvertent enablement of a single programmable interconnect point (PIP) between two interconnect lines. In other words, if two interconnect lines used to implement two different nets are separated by a single PIP, the nets are assigned to different groups.

In one embodiment, the nets are divided into groups by identifying potentially conflicting pairs of interconnect lines (pairs of interconnect lines that can be shorted together by the inadvertent enablement of a single PIP). Potentially conflicting pairs of nets are identified by their association with the potentially conflicting pairs of interconnect lines. All of the nets in the specified design are then divided into groups, such that no two of the nets in a single group form a potentially conflicting pair of nets.

In one embodiment, the nets are divided into groups using the well-known graph coloring algorithm. The nodes in the graph are the nets that are used in the specified design. The arcs in the graph (i.e., the adjacencies) are the potential conflicts between two nets that can potentially be shorted together by a single defectively-enabled PIP.

Once all of the nets in the specified design have been divided into groups, the groups are tested for inadvertent shorts.

According to a first aspect of the invention, each group is tested sequentially, i.e., one group is tested at a time. For example, all nets in a first group are tested first, followed by all nets in the second group, and so forth.

In one embodiment, each group of nets is tested by applying a first value to each net in the group and applying a second and different value to all interconnect lines not associated with nets in the group. The values of the nets in the group under test are then monitored and compared to the first value to determine whether any net in the group is shorted to an interconnect line not associated with any net in the group. This embodiment detects all single defects (e.g., defects to a single PIP or to a memory cell controlling a single PIP) that affect the design by shorting together two nets in the design. In addition, this embodiment detects all single defects that affect the design by shorting a net in the design to an unused interconnect line.

In another embodiment, each group of nets is tested by applying a first value to each net in the group and applying a second and different value to all nets in other groups. The values of the nets in the group under test are then monitored and compared to the first value to determine whether any net in the group is shorted to a net in another group. This embodiment detects all single defects that affect the design by shorting together two nets in the design. Single defects that affect the design by shorting a net in the design to an unused interconnect line are not detected using this method.

According to the first aspect of the invention, the nets are divided into groups and each group is tested sequentially. However, a second aspect of the invention allows for the simultaneous testing of nets in all groups.

According to a second aspect of the invention, all of the groups are tested at the same time. However, each group of nets is tested using a different applied stimulus pattern, i.e., a different sequence of high and low values. Therefore, no two nets that can be shorted together by the inadvertent enablement of a single PIP use the same stimulus pattern. Hence, any single defect that shorts together two nets will be detected by comparing the detected value pattern for a net to the stimulus pattern applied to the group of nets.

In some embodiments, the detected value pattern and the stimulus patterns applied to other groups of nets are compared. From the results of this comparison, it can be determined which two groups of nets are participating in the short.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of, programmable logic devices. The present invention has been found to be particularly applicable and beneficial for field programmable gate arrays (FPGAs) having programmable interconnect points (PIPs) controlled by configuration memory cells implemented as static RAM cells. However, the present invention is not so limited.

Figure 2:
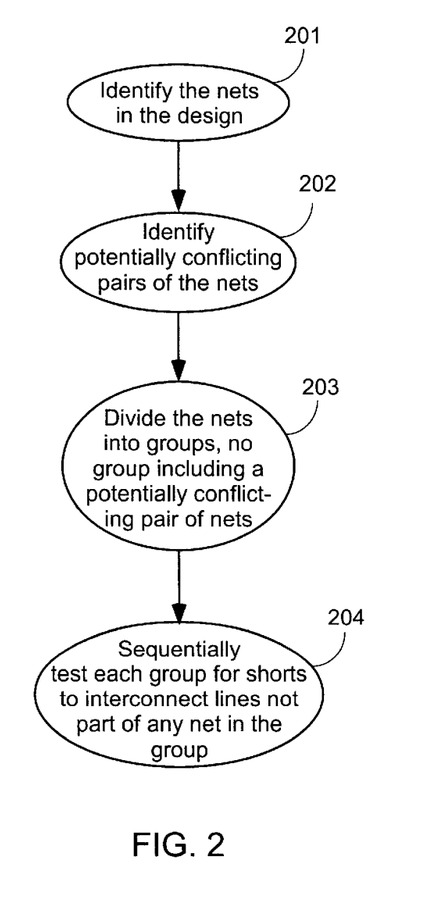
FIG. 2 shows a method of testing for shorts in a specified design implemented in a partially defective PLD, according to an embodiment of the invention.

FIG. 2 shows one method of testing for shorts in a specified design implemented in a partially defective PLD. In step 201, all of the nets in the design are identified. For example, in one embodiment a computer data structure is created that includes an entry for each net in the design.

In step 202, all potentially conflicting pairs of nets are identified. A potentially conflicting pair of nets is a pair of nets that can be shorted together by the inadvertent enablement of a single PIP between two interconnect lines in the PLD. For example, where the PLD is an FPGA, the defect causing the short can be a defect in the PIP itself, or in the configuration memory cell controlling the PIP. In one embodiment, the computer data structure created in step 201 is modified such that the data entry for each net includes a listing of all other nets in the design with which the instant net forms a potentially conflicting pair of nets.

Figure 3:
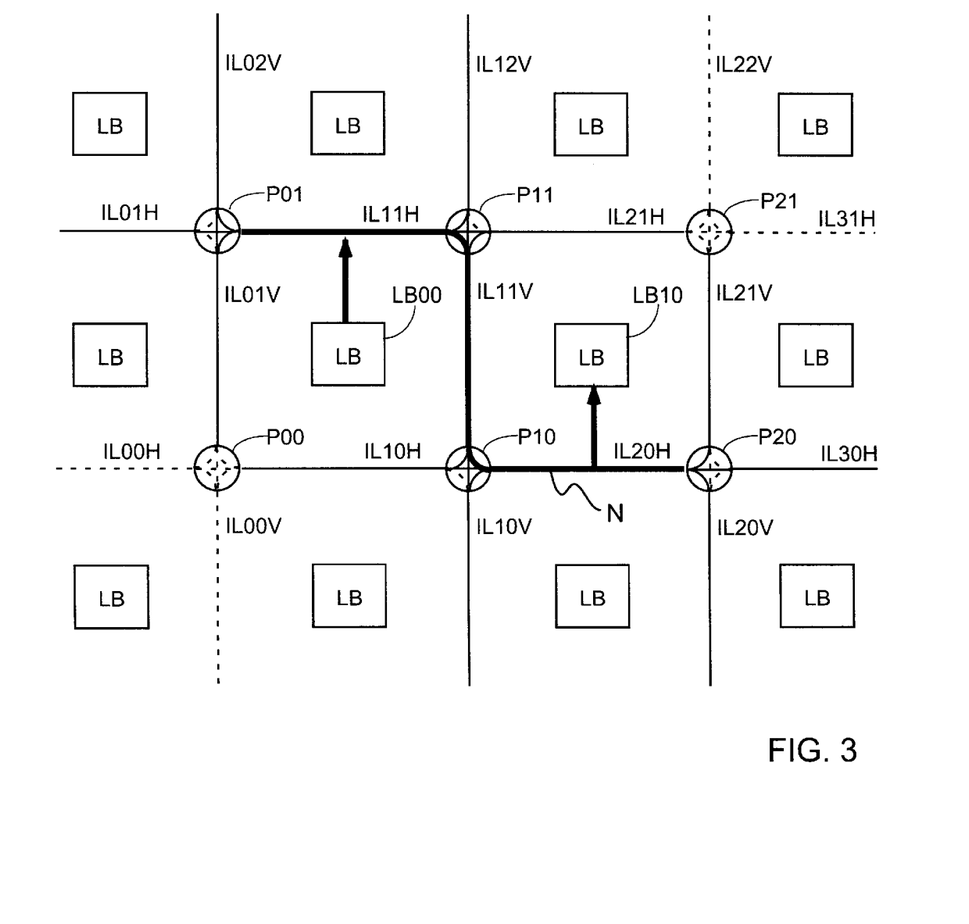
FIG. 3 shows an exemplary portion of a design implementation that can be tested for shorts using the methods of the invention.

FIG. 3 shows a net implemented in an exemplary PLD. The PLD includes an array of logic blocks (LB), horizontal interconnect lines (ILxH), vertical interconnect lines (ILxV), and PIPs (Px) that programmably couple the interconnect lines to one another. The net N indicated by a heavy line is driven by a logic block LB00, has a destination. at logic block LB10, and traverses interconnect lines IL11H, IL11V, IL20H and PIPs, P11, P10.

Note that a defect in any of PIPs P01, P11, P10, or P20 can cause an inadvertent short between net N and one of the interconnect lines indicated using solid (but not heavy) lines. Dashed lines indicate interconnect lines that cannot be shorted to net N by a defect in a single PIP. Thus, net N forms a potentially conflicting pair of nets with any other net that includes any of the interconnect lines IL10V, IL20V, IL10H, IL30H, IL01V, IL21V, IL01H, IL21H, IL02V, and IL12V.

Returning to FIG. 2, in step 203 the identified nets are divided into groups, where none of the groups includes any potentially conflicting pair of nets. While any method can be used for dividing the nets into such groups, a preferred embodiment applies the well-known graph coloring algorithm. The nodes in the graph are the nets that are used in the specified design. The arcs in the graph (i.e., the adjacencies) are the potential conflicts between two nets that can potentially be shorted together by a single defectively-enabled PIP.

For example, referring to FIG. 3, assume that a specified design includes four nets A, B, C, and D. Net A is the net shown in heavy lines in FIG. 3; net B uses interconnect line IL22V; net C uses interconnect line IL21V; and net D uses interconnect line IL00V. Therefore, nets A and C have a potential conflict, and nets B and C have a potential conflict. Hence, net C cannot be placed in the same group as either net A or net B. Net D has no potential conflicts with any of nets A, B, and C.

The resulting adjacency graph is as follows:

A--C--B  D

A graph coloring algorithm applied to this adjacency graph finds that nets A and B must differ from net C, so two different colors (i.e., two different groups) are required. Net D can be assigned either color, i.e., can be placed in either group.

Returning again to FIG. 2, in step 204 the groups are tested sequentially for shorts to interconnect lines not associated with any net in the group. That is, a first group is tested, then a second group is tested, and so on. Known testing methods can be used, such as the testing methods described in the Background section, above.

Figure 4:
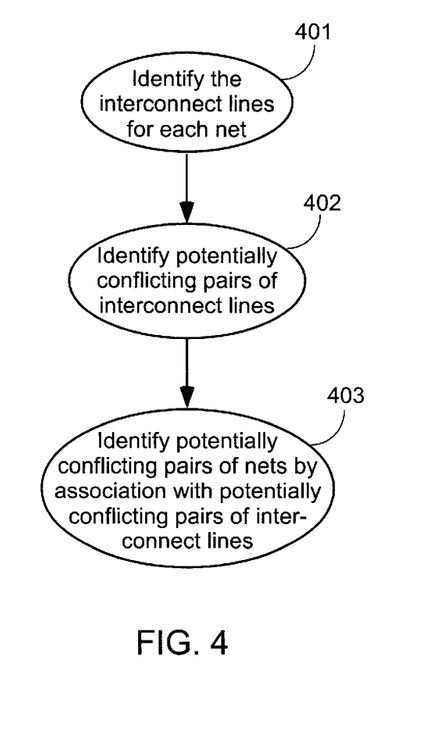
FIG. 4 shows a method of detecting potentially conflicting pairs of nets that can be used, for example, with the method of FIG. 2.

FIG. 4 shows one method that can be used to identify all potentially conflicting pairs of nets in the design. For example, the method of FIG. 4 can be used to perform step 202 of FIG. 2.

In step 401, the interconnect lines associated with each net are identified. For example, referring to FIG. 3, for net N the interconnect lines IL11H, IL11V, IL20H are identified as being associated with the net.

In step 402, all potentially conflicting pairs of the interconnect lines are identified. A potentially conflicting pair of interconnect lines is any pair of interconnect lines that can be inadvertently shorted together by a defect in a single PIP. For example, interconnect line IL11V of FIG. 3 is included in six potentially conflicting pairs of interconnect lines, with interconnect lines IL11H, IL12V, IL21H, IL10H, IL10V, and IL20H.

In step 403, all potentially conflicting pairs of nets are identified by their association with the identified potentially conflicting pairs of interconnect lines. In other words, each interconnect line in the pair has an associated net; if the two interconnect lines form a potentially conflicting pair then the two nets also form a potentially conflicting pair.

Figure 5:
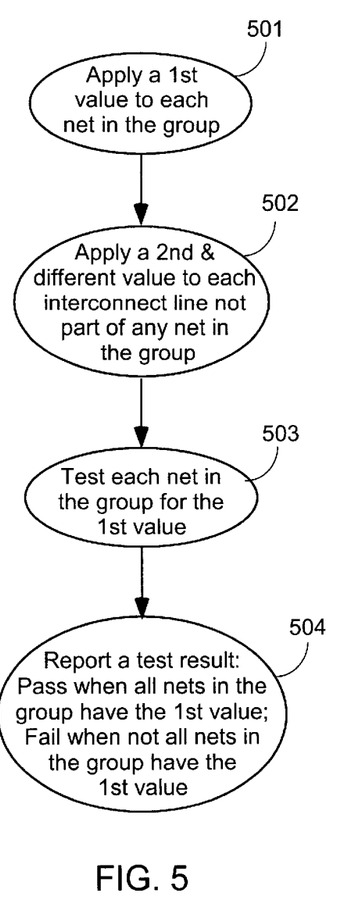
FIG. 5 shows a first method of testing a group of nets that can be used, for example, with the method of FIG. 2.

FIG. 5 shows a first method of testing a group of nets for shorts to interconnect lines not part of any net in the group. For example, the method of FIG. 5 can be used to perform step 204 of FIG. 2 for one group. This testing method can be applied, for example, when each net in the group is to be tested against interconnect lines included in other groups and also against unused interconnect lines (interconnect lines not associated with any net in the design).

In step 501, a first value is applied to each net in the group. In step 502, a second and different value is applied to each interconnect line that is not part of any net in the group. In step 503, each net in the group is tested for the first value.

For example, the nets in the group can be driven high, while all interconnect lines not part of any net in the group are driven to ground. Alternatively or additionally, the nets in the group can be driven low, while all interconnect lines not part of any net in the group are driven high. In one embodiment, both tests are performed. By performing both tests, in addition to testing each net in the group for shorts, it is also verified that each net can be driven both high and low. Thus, this procedure detects PIP defects where the PIP is defectively driving one or the other interconnect line to a constant high or low value. In other words, the procedure has detected not only shorts between two interconnect lines used in the design, but also shorts between an interconnect line used in the design and power high or ground.

In step 504, a test result is reported. When all nets in the group under test have the first value, the results do not show a short, and a "pass" result is reported. When not all nets in the group have the first value, a short has occurred, and a "fail" result is reported.

Known methods can be used to report test results. For example, as described in the Background section, the value on each net can be provided to the tester via an output terminal of the PLD using well-known PLD data readback or JTAG techniques. Alternatively, using another known technique, other PLD resources can be configured to perform a logic function on the test results of one or more nets, and to provide the results to the tester.

Figure 6:
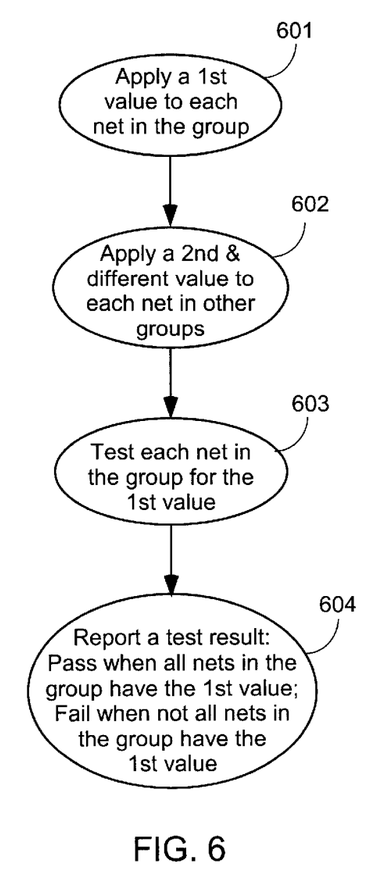
FIG. 6 shows a second method of testing a group of nets that can be used, for example, with the method of FIG. 2.

FIG. 6 shows a second method of testing a group of nets for shorts to interconnect lines not part of any net in the group. For example, the method of FIG. 6 can be used to perform step 204 of FIG. 2. This testing method can be applied when each net in the group is to be tested against interconnect lines included in other groups.

The method of FIG. 6 is similar to the method of FIG. 5, except that in step 602 the second and different value is applied to each net in the other groups. Unused interconnect lines need not be tested when this method is used.

The method of FIG. 6 can be used, for example, when shorts to unused interconnect lines are tested for separately using the known methods described in the Background section. The method of FIG. 6 is also suitable for situations where shorting a net in the design to an unused interconnect line is acceptable. For example, if adding the capacitance of an unused interconnect line to a net would not affect the operating speed of the circuit (e.g., the net has a static value), this test can be applied.

Figure 7:
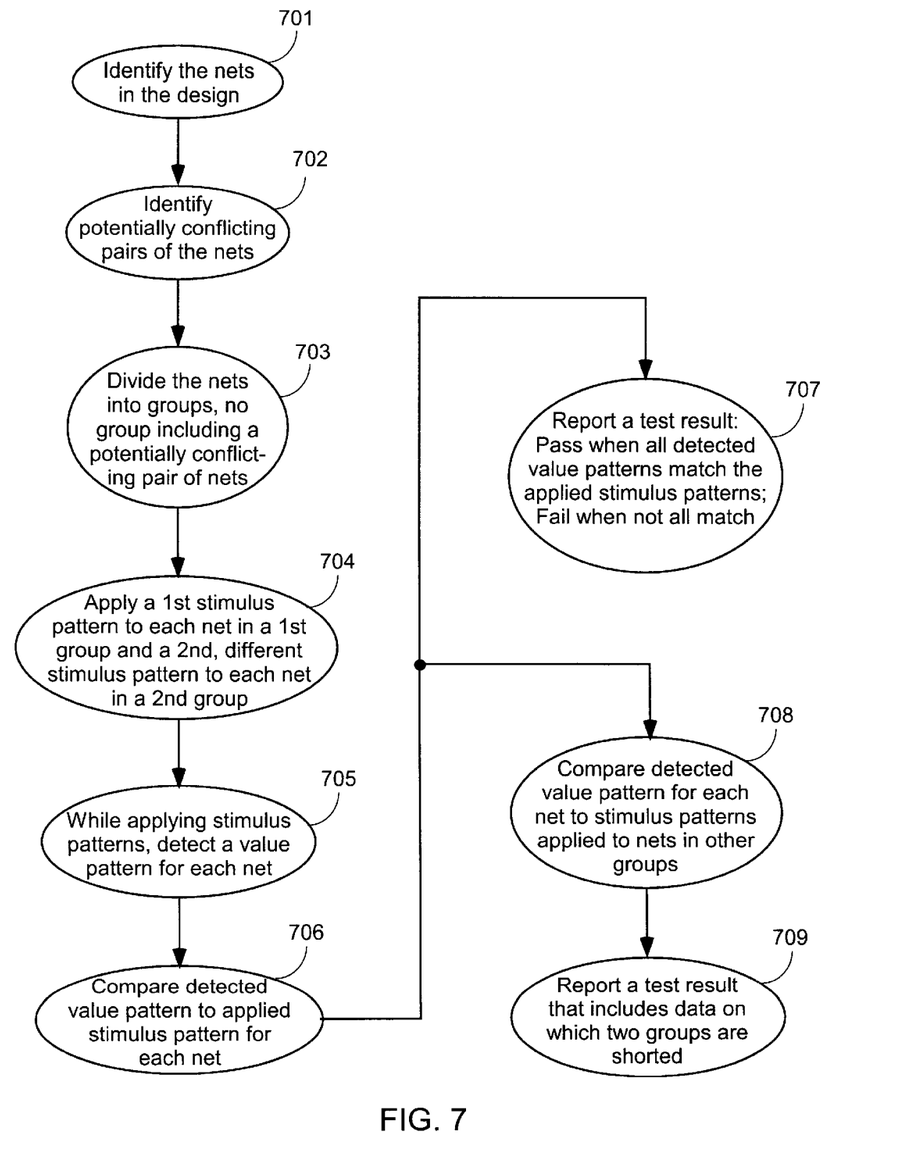
FIG. 7 shows another method of testing for shorts in a specified design implemented in a partially defective PLD, according to another embodiment of the invention.

FIG. 7 shows a method for testing for shorts in a specified design implemented in a partially defective PLD according to a second aspect of the intention. According to this method, several groups are tested at the same time, but using a different applied stimulus pattern, i.e., a different sequence of high and low values. (In some embodiments, all of the groups are tested at once, while in other embodiments several groups are tested at one time, but multiple tests are still performed.) Because each group is tested using a different sequence of values, each group differs from every other group at least once during the sequence. As in the earlier-described embodiments, no two nets in any one group have potential conflicts. Therefore, a short between two nets in the design will be detected just as in the earlier methods.

However, in some embodiments this method provides an additional capability. By ensuring that each stimulus pattern differs from every other stimulus pattern at a different point in the pattern, exactly which two groups are shorted together can be easily determined.

For example, suppose that there are three groups of nets in a design, where none of the groups includes any potentially conflicting pairs of nets. Group A is assigned the stimulus pattern of 1-0-0, Group B is assigned the stimulus pattern of 0-1-0, and Group C is assigned the stimulus pattern of 0-0-1. If there is an anomalous test result in the first portion of the pattern, then a net in group A is involved (i.e., is shorted to a net in one of the other groups). If there is an anomalous result in the second portion of the pattern, then a net in group B is involved. Finally, if there is an anomalous result in the third portion of the pattern, then a net in group C is involved. For example, a short between nets in groups A and B would show anomalous results in both the first and second portions of the stimulus pattern.

In step 701, all of the nets in the design are identified. In step 702, all potentially conflicting pairs of nets are identified. In one embodiment, the steps shown in FIG. 4 are followed to identify the potentially conflicting pairs of nets. In step 703, the nets are divided into groups, where no group includes a potentially conflicting pair of nets. In one embodiment, the well-known graph coloring algorithm is used to perform the division, where the nodes in the graph are the nets and the adjacencies are the potential conflicts between the nets identified in step 702.

In step 704, a first stimulus pattern is applied to each net in a first group, and a second, different stimulus pattern is applied to each net in a second group. In step 705, which occurs while the stimulus patterns are still being applied, a value pattern for each net is detected. In step 706, the detected value pattern for each net is compared to the stimulus pattern applied to the group to which the net belongs.

In step 707, a test result is reported. When all nets in the group under test have detected value patterns that match the applied stimulus pattern for the group, the results do not show a short, and a "pass" result is reported. When the value patterns do not all match the applied stimulus pattern for the group, a short has occurred, and a "fail" result is reported.

FIG. 7 also illustrates an embodiment where, instead of simply reporting a "pass" or "fail" result, a comparison is performed between the detected value pattern of each net and the stimulus patterns applied to the nets in other groups (step 708). As in the simple example given above, the two groups participating in the short can be identified through this comparison, and the results reported using any known method (step 709).

In the embodiment of FIG. 7, unused interconnect lines can be treated as separate nets and can be given a unique sequence, thereby permitting testing for shorts to the unused interconnect lines.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform.

Those having skill in the relevant arts of the invention will now perceive various modifications and additions that can be made as a result of the disclosure herein. For example, the above text describes the methods of the invention in the context of PLDs such as field programmable gate arrays (FPGAs). However, the methods of the invention can also be implemented in other PLDs having interconnect lines and programmable interconnect points subject to defects causing inadvertent shorting between the interconnect lines.

Accordingly, all such modifications and additions are deemed to be within the scope of the invention, which is to be limited only by the appended claims and their equivalents.

What is claimed is:

1. A method of detecting shorts affecting nets of a specified design implemented in a partially defective programmable logic device (PLD) comprising interconnect lines and programmable interconnect points (PIPs) between the interconnect lines, the method comprising:
   identifying the nets in the specified design;
   identifying potentially conflicting pairs of the nets that can be shorted together by an inadvertent enablement of a single PIP;
   dividing the nets into a plurality of groups, wherein no two of the nets in a single group form a potentially conflicting pair of the nets; and
   sequentially testing each group of the nets for a short between one or more of the nets in the group and one or more interconnect lines not associated with any of the nets in the group.

2. The method of claim 1, wherein identifying potentially conflicting pairs of the nets comprises:
   identifying the interconnect lines associated with each of the nets;
   identifying potentially conflicting pairs of the interconnect lines that can be shorted together by an inadvertent enablement of a single PIP; and
   identifying potentially conflicting pairs of the nets associated with the potentially conflicting pairs of the interconnect lines.

3. The method of claim 1, wherein dividing the nets into a plurality of groups is performed using a graph coloring technique, with nodes of the graph corresponding to the nets and adjacencies between the nodes being determined by the potentially conflicting pairs of the nets.

4. The method of claim 1, wherein sequentially testing each group of the nets comprises, for each group taken one group at a time:
   applying a first value to each net in the group;
   applying a second value different from the first value to each interconnect line not associated with any net in the group; and
   testing the nets in the group for the first value.

5. The method of claim 4, further comprising reporting a test result for the specified design in the partially defective PLD, wherein:
   the test result indicates a "pass" when all nets in the group have the first value; and
   the test result indicates a "fail" when not all nets in the group have the first value.

6. The method of claim 1, wherein sequentially testing each group of the nets comprises, for each group taken one group at a time:
   applying a first value to each net in the group;
   applying a second value different from the first value to each net in the other groups; and
   testing each net in the group for the first value.

7. The method of claim 6, further comprising reporting a test result for the specified design in the partially defective PLD, wherein:
   the test result indicates a "pass" when all nets in the group have the first value; and
   the test result indicates a "fail" when not all nets in the group have the first value.

8. A method of detecting shorts affecting nets of a specified design implemented in a partially defective programmable logic device (PLD) comprising interconnect lines and programmable interconnect points (PIPs) between the interconnect lines, the method comprising:
   identifying the nets used in the specified design;
   identifying potentially conflicting pairs of the nets that can be shorted together by an inadvertent enablement of a single PIP;
   dividing the nets into a plurality of groups, wherein no two of the nets in a single group form a potentially conflicting pair of the nets;
   applying a stimulus pattern to each net, wherein a first stimulus pattern is applied to each net in a first group, and a second stimulus pattern different from the first stimulus pattern is applied to each net in a second group;
   detecting value patterns on each of the nets while applying the stimulus patterns; and
   comparing the detected value patterns to the applied stimulus patterns for each net.

9. The method of claim 8, wherein identifying potentially conflicting pairs of the nets comprises:
   identifying the interconnect lines associated with each of the nets;
   identifying potentially conflicting pairs of the interconnect lines that can be shorted together by an inadvertent enablement of a single PIP; and
   identifying potentially conflicting pairs of the nets associated with the potentially conflicting pairs of interconnect lines.

10. The method of claim 8, wherein dividing the nets into a plurality of groups is performed using a graph coloring technique, with nodes of the graph corresponding to the nets and adjacencies between the nodes being determined by the potentially conflicting pairs of the nets.

11. The method of claim 8, further comprising reporting a test result for the specified design in the partially defective PLD, wherein:
   the test result indicates a "pass" when the detected value pattern is the same as the applied stimulus pattern for each net; and
   the test result indicates a "fail" when the detected value pattern is not the same as the applied stimulus pattern for each net.

12. The method of claim 8, further comprising:
   comparing the detected value patterns for each net to the stimulus patterns applied to nets in other groups; and
   reporting a test result for the specified design in the partially defective PLD, wherein the test result includes data on which two groups include nets that are shorted to each other.

13. A method of detecting shorts affecting nets of a specified design implemented in a partially defective programmable logic device (PLD) comprising interconnect lines and programmable interconnect points (PIPs) between the interconnect lines, the method comprising:

identifying the nets in the specified design;

identifying potentially conflicting pairs of the nets that can be shorted together by an inadvertent enablement of a single PIP;

dividing the nets into a plurality of groups, wherein no two nets in a single group form a potentially conflicting pair of nets that can be shorted together by an inadvertent enablement of a single PIP, a first group comprising a first net and a second group comprising a second net; and testing for a short between the first and second nets.

14. The method of claim 13, wherein identifying potentially conflicting pairs of the nets comprises:

identifying the interconnect lines associated with each of the nets;

identifying potentially conflicting pairs of the interconnect lines that can be shorted together by an inadvertent enablement of a single PIP; and identifying potentially conflicting pairs of the nets associated with the potentially conflicting pairs of interconnect lines.

15. The method of claim 13, wherein dividing the nets into a plurality of groups is performed using a graph coloring technique, with nodes of the graph corresponding to the nets and adjacencies between the nodes being determined by the potentially conflicting pairs of nets.

16. The method of claim 13, further comprising, while testing for a short between the first and second nets, also testing for shorts between other nets in the first group and the second net.

17. The method of claim 13, further comprising, while testing for a short between the first and second nets, also testing for shorts between the first net and unused interconnect lines not included in any of the nets.

18. The method of claim 13, further comprising, after testing for a short between the first and second nets, testing for a short between the second net and a third net in a third group.

19. The method of claim 13, wherein testing for a short between the first and second nets comprises:

applying a first stimulus pattern to the first net;

applying a second stimulus pattern to the second net while applying the first stimulus pattern, the second stimulus pattern not being the same as the first stimulus pattern;

detecting a value pattern on the first net while applying the first and second stimulus patterns; and comparing the detected value pattern to the applied first stimulus pattern.

20. The method of claim 19, further comprising:

comparing the detected value pattern to the applied second stimulus pattern.

21. A computer-readable medium including stored instructions for testing for shorts between nets of a specified design implemented in a partially defective programmable logic device (PLD) comprising interconnect lines and programmable interconnect points (PIPs) between the interconnect lines, the computer-readable medium comprising:

first computer instructions for applying a first stimulus pattern to a first net in the specified design;

second computer instructions for applying a second stimulus pattern to a second net while applying the first stimulus pattern, the second stimulus pattern not being the same as the first stimulus pattern, the first and second nets being nets that can be shorted together by an inadvertent enablement of a single PIP;

third computer instructions for detecting a value pattern on the first net while applying the first and second stimulus patterns; and fourth computer instructions for comparing the detected value pattern to the applied first stimulus pattern.

22. A computer-readable medium including stored instructions for testing for shorts between nets of a specified design implemented in a partially defective programmable logic device (PLD) comprising interconnect lines and programmable interconnect points (PIPs) between the interconnect lines, the computer-readable medium comprising:

first computer instructions for applying a first value to each net in a group of nets of the specified design, wherein no two nets in the group can be shorted together by an inadvertent enablement of a single PIP;

second computer instructions for applying a second value different from the first value to one or more interconnect lines not in the group; and third computer instructions for testing the nets in the group for the first value.

* * * * *